United States Patent
Park et al.

(10) Patent No.: US 7,636,265 B2
(45) Date of Patent: Dec. 22, 2009

(54) FLASH MEMORY DEVICE CAPABLE OF REDUCED PROGRAMMING TIME

(75) Inventors: Min-Gun Park, Suwon-si (KR); Jin-Wook Lee, Seoul (KR); Sang-Won Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 413 days.

(21) Appl. No.: 11/264,168

(22) Filed: Nov. 2, 2005

(65) Prior Publication Data

US 2006/0279994 A1  Dec. 14, 2006

(30) Foreign Application Priority Data

Jun. 13, 2005 (KR) .................... 10-2005-0050470

(51) Int. Cl.
  *G11C 7/00* (2006.01)
  *G11C 7/22* (2006.01)
(52) U.S. Cl. ..................... 365/189.16; 365/189.09; 365/185.18
(58) Field of Classification Search ............ 365/185.18, 365/189.09
  See application file for complete search history.

(56) References Cited

U.S. PATENT DOCUMENTS 5,890,191 A * 3/1999 Espinor et al. ............. 711/103
6,147,906 A 11/2000 Bill et al.
6,256,229 B1 * 7/2001 Roohparvar ............ 365/185.18
6,542,411 B2 * 4/2003 Tanikawa et al. ....... 365/185.33
6,680,868 B2 1/2004 Akamatsu
6,930,925 B2 * 8/2005 Guo et al. ............... 365/185.28

FOREIGN PATENT DOCUMENTS

| JP | 10-241388 | 9/1998 |
|---|---|---|
| JP | 2002-230985 | 8/2001 |
| JP | 2002025287 | 1/2002 |
| JP | 2002-133878 | 5/2002 |
| KR | 1020020031315 | 5/2002 |
| KR | 1020030093120 A | 12/2003 |

OTHER PUBLICATIONS

German Patent Office, Office Action dated Mar. 18, 2009.

* cited by examiner

*Primary Examiner*—Hoai V Ho
*Assistant Examiner*—Kretelia Graham
(74) *Attorney, Agent, or Firm*—Volentine & Whitt, PLLC (57) ABSTRACT

A flash memory device comprising a high voltage generator circuit that is adapted to supply a program voltage having a target voltage to a selected word line is provided. The flash memory device is adapted to terminate the program interval in accordance with when the program voltage has been restored to the target voltage after dropping below the target voltage. A method for operating the flash memory device is also provided.

20 Claims, 7 Drawing Sheets

Fig. 1

(PRIOR ART)

FLASH MEMORY DEVICE CAPABLE OF REDUCED PROGRAMMING TIME

BACKGROUND OF THE INVENTION

1. Field of the Invention

Embodiments of the present invention are related to memory devices. In particular, embodiments of the invention are related to a flash memory device in which the total programming time may be reduced. Embodiments of the invention are also related to programming methods for such a flash memory device.

This application claims priority to Korean Patent Application No. 2005-50470, filed Jun. 13, 2005, the subject matter of which is hereby incorporated by reference in its entirety.

2. Description of Related Art

An increasing need exists for non-volatile semiconductor memory devices that may be programmed and erased without the requirement of providing a data refresh operation for data stored in the device. The general trend in all semiconductor memory device development is one characterized by increased storage capacity and a high degree of integration. The NAND flash memory device is one example of a non-volatile semiconductor memory device that provides large storage capacity and a high degree of integration. Since the NAND flash memory device retains stored data even when power is not supplied to the device, it is used widely in electronic devices, such as portable terminals, portable computers, and the like, which can suffer sudden power interruptions.

Conventional NAND flash memory devices typically comprise electrically erasable and programmable read-only memory cells called "flash EEPROM cells." In general, a flash EEPROM cell comprises a cell transistor formed from a semiconductor substrate (or bulk) of first conductivity type (e.g., P-type), and source and drain regions of second conductivity type (e.g., N-type). The source and drain regions are separated by a channel region, and a floating gate is formed on the channel region. The floating gate stores electrons and controls the gate function for the cell transistor.

One conventional memory cell array comprising flash EEPROM cells (hereinafter, referred to as memory cells) having the structure described above is illustrated in FIG. 1. Of note, in the preceding description, when a layer or element is referred to as being formed "on" another element or layer, it may be formed directly on that layer, or intervening layers may be present.

Figure 1:
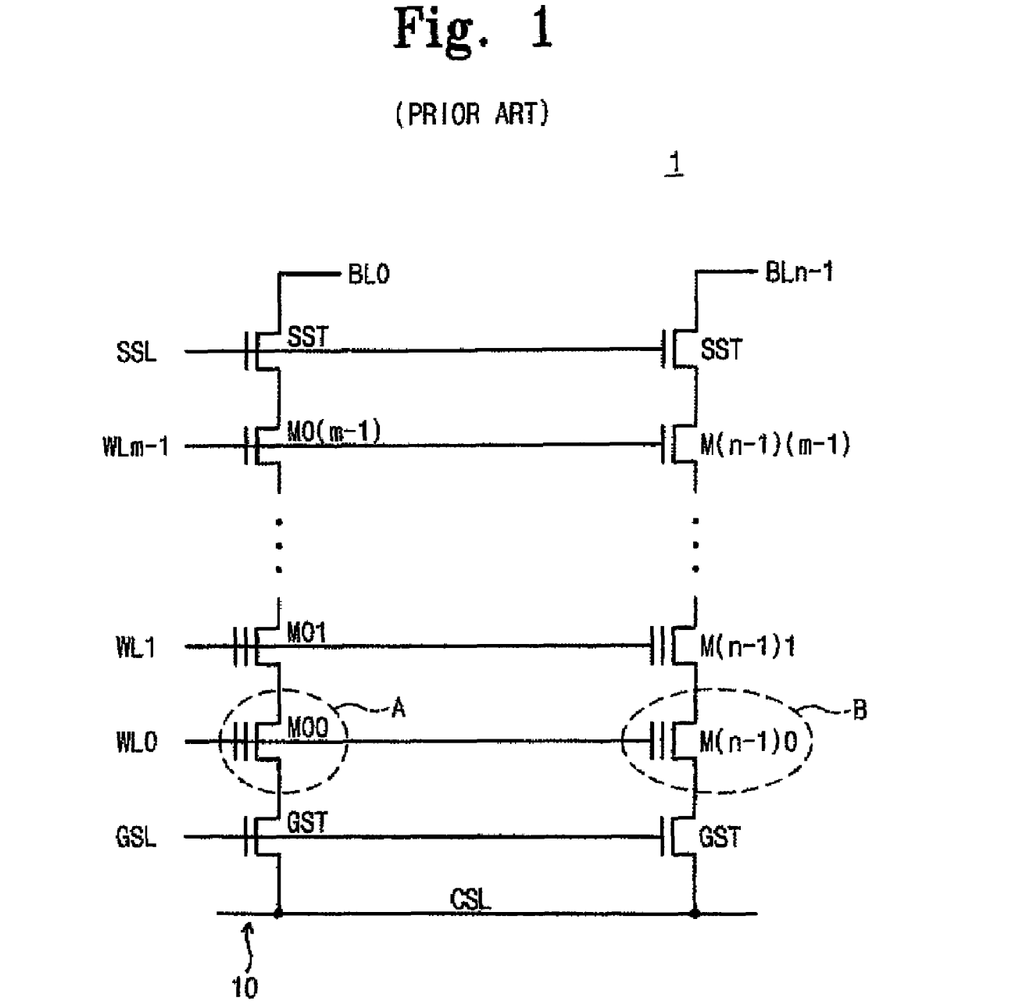
FIG. 1 is a circuit diagram showing a conventional memory cell array structure.

Referring to FIG. 1, a memory cell array (or memory block) 1 comprises a plurality of cell strings (or NAND strings) 10 corresponding to bit lines BL0 through BLn−1, respectively. Each cell string 10 comprises a string select transistor SST as a first select transistor, a ground select transistor GST as a second select transistor, and a plurality of memory cells M(x)0 through M(x)(m−1) (where x is a number between 0 and (n−1)). String select transistor SST has a drain connected to a corresponding bit line and a gate connected to a string select line SSL. Ground select transistor GST has a source connected to a common source line CSL and a gate connected to a ground select line GSL. Memory cells M(x)0 through M(x)(m−1) are connected in series between a source of string select transistor SST and a drain of ground select transistor GST. Memory cells M(x)0 through M(x)(m−1) are connected to corresponding word lines WL0 through WLm−1, respectively. Word lines WL0 through WLm−1, string select line SSL, and ground select line GSL are driven by a row selector circuit (not shown).

In order to program the memory cells of a selected row (or word line) of a NAND flash memory device, the memory cells in a memory block (or a memory cell array) are first erased in order to give each memory cell a threshold voltage that is below 0V. Once the memory cells are erased, program data is loaded onto a page buffer circuit of the NAND flash memory device, and then a high voltage pump circuit generates relatively high voltages for a programming operation (e.g., a pass voltage and a program voltage are supplied to word lines). Afterward, the loaded data is programmed into the memory cells of a selected word line by the iteration of program loops. Each of the program loops consists of a bit line setup interval, a program interval, a discharge/recovery interval, and a verification interval.

During the bit line setup interval, bit lines BL0 through BL(n−1) are charged to a power supply voltage or a ground voltage in accordance with the loaded program data. That is, a bit line connected to a memory cell to be programmed is charged to the ground voltage, and a bit line connected to a memory cell to be program inhibited (i.e., not programmed) is charged to the power supply voltage. Within the program interval, the program voltage is supplied to a selected word line and the pass voltage is supplied to the unselected word lines. For memory cells connected to bit lines that are charged to the ground voltage, a bias condition great enough to induce F-N tunneling is satisfied, so electrons are injected to the floating gates of the memory cells from the bulk. On the other hand, as is well known in the art, memory cells connected to bit lines that are charged to the power supply voltage are program inhibited. The voltages of the bit lines and the word lines are discharged during the discharge interval, which functions as a recovery interval, and whether memory cells have a target threshold voltage is determined during the verification interval.

The programming operation described above is disclosed in U.S. Pat. No. 6,353,555, the subject matter of which is hereby incorporated by reference in its entirety. A program inhibition method is disclosed in U.S. Pat. Nos. 5,677,873, and 5,991,202, and the subject matter each of these patents is hereby incorporated by reference in its entirety.

In accordance with the above description, the program voltage is supplied to a selected word line during a program interval (i.e., a program execution time). Application of the program voltage to a selected word line is made during the program interval, which accounts for a large portion of a program loop time (i.e., the length of time needed to execute a program loop). In general, the length of the program interval is determined in accordance with RC delay time and the program voltage restoration time, each of which will be described below.

For each memory cell of a selected word line, the time needed to set the control gate voltage of the memory cell to the program voltage varies in accordance with the distance of the memory cell from the row selector circuit of the NAND flash memory device. That is, referring to FIG. 1, the time needed to set the control gate voltage of a cell A, which is relatively near the row selector circuit, is shorter than the time needed to set the control gate voltage of a cell B, which is relatively far from the row selector circuit, because the control gate loading and corresponding signal flight time for cell B is greater than that of cell A. That is, different RC delay periods exist between memory cells A and B which are connected to the same word line.

When a program voltage is supplied to a selected word line, the voltage supplied drops below a target voltage due to the process of loading the selected word line. A high voltage generator circuit restores the supplied program voltage to the target voltage. The time needed to restore the reduced program voltage to the target voltage is called the program voltage restoration/recovery time.

Unfortunately, both the program voltage restoration time and the RC delay time vary in accordance with process, voltage, and peripheral conditions. For this reason, these times are set in order to accommodate for the worst case conditions (i.e., the conditions that would cause the program voltage restoration time and the RC delay time to be the longest). That is, a margin is added to the program execution time in order to accommodate for the worst case conditions.

In order to meet the continuous need for high-speed memories, it would be beneficial to reduce the program loop time (i.e., a total programming time).

SUMMARY OF THE INVENTION

In one embodiment, the invention provides a flash memory device comprising control logic adapted to activate a first flag signal during a program interval of each program loop, wherein a program voltage is supplied to a selected word line in accordance with the first flag signal. The flash memory device further comprises a high voltage generator circuit adapted to generate the program voltage and generate a second flag signal during the program interval, wherein the second flag signal indicates whether the program voltage has been restored to a target voltage, and a program execution end signal generator circuit adapted to generate a program execution end signal in accordance with the first and second flag signals, wherein, upon generation of the program execution end signal, the control logic deactivates the first flag signal in order to terminate the program interval.

In another embodiment, the invention provides a flash memory device comprising control logic adapted to generate a first flag signal during a program interval of each program loop, wherein a program voltage is supplied to a selected word line in accordance with the first flag signal, and a high voltage generator circuit adapted to generate the program voltage and generate a second flag signal during the program interval, wherein the second flag signal indicates whether the program voltage has been restored to a target voltage. The flash memory device further comprises a dip signal generator circuit adapted to generate a dip signal in accordance with the first and second flag signals, wherein the dip signal indicates whether the program voltage has dropped below the target voltage, a restoration signal generator circuit adapted to generate, in accordance with the first and second flag signals, a restoration signal indicating whether the program voltage has been restored to the target voltage, and a first end signal generator circuit adapted to generate a first end signal in accordance with the restoration signal, wherein the control logic is adapted to deactivate the first flag signal, when the first end signal is generated, in order to terminate the program interval.

In yet another embodiment, the invention provides a flash memory device comprising control logic adapted to generate a flag signal, wherein a program voltage is supplied to a selected word line in accordance with the flag signal during a program interval of each program loop, and a high voltage generator circuit adapted to generate the program voltage supplied to the selected word line. The flash memory device further comprises a row selector circuit connected to one end of the selected word line and adapted to supply the program voltage to the selected word line in accordance with the flag signal, and a detector circuit connected to the other end of the selected word line, and adapted to detect whether a voltage of the other end of the selected word line has reached the program voltage, and adapted to generate a program execution end signal when it does reach the program voltage, wherein, when the program execution end signal is generated, the control logic deactivates the flag signal in order to terminate the program interval.

In still another embodiment, the invention provides a method of programming a flash memory device that comprises preparing a program voltage when a program command is received, activating a first flag signal, supplying the program voltage to a selected word line during a program interval of each program loop in accordance with the first flag signal, and terminating the program interval in accordance with a voltage level of the program voltage or after a second length of time elapses after the flag signal is activated.

BRIEF DESCRIPTION OF THE DRAWINGS

Exemplary embodiments of the invention will be described in detail with reference to the attached drawings in which like reference symbols indicate the same or similar components. In the drawings.

DESCRIPTION OF EXEMPLARY EMBODIMENTS

Figure 2:
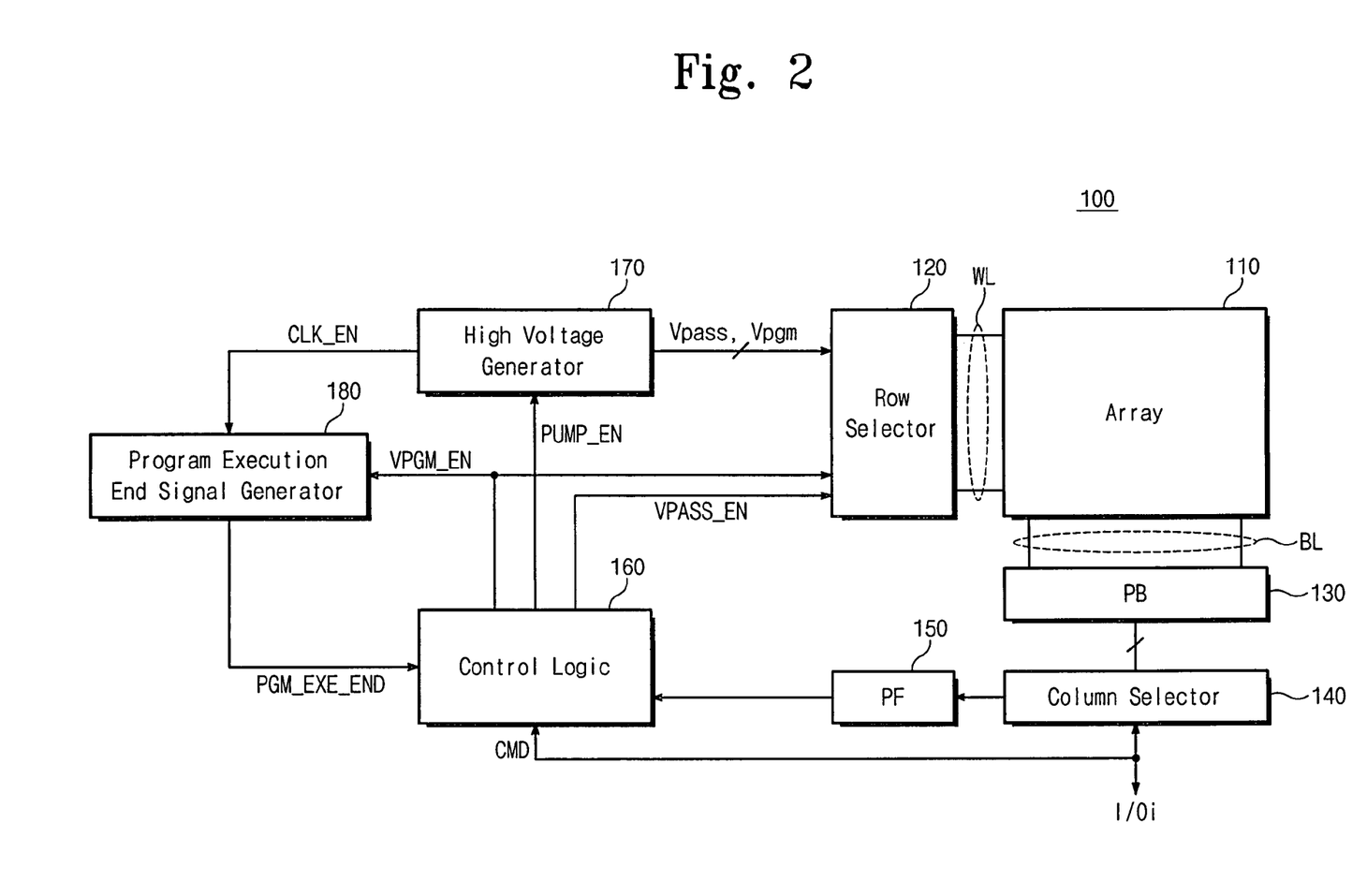
FIG. 2 is a block diagram illustrating a flash memory device in accordance with an exemplary embodiment of the present invention.

FIG. 2 is a block diagram illustrating a flash memory device in accordance with an exemplary embodiment of the present invention.

Referring to FIG. 2, a flash memory device 100 comprises a memory cell array 110, which has one or more memory blocks. Each memory block may be configured in the same way as the memory block illustrated in FIG. 1, for example. Adapted to function as a row decoder circuit, a row selector circuit 120 selects one of the word lines in memory cell array 110. During a programming operation, row selector circuit 120 supplies a program voltage Vpgm to a selected word line and a pass voltage Vpass to unselected word lines. Also, during the programming operation, a page buffer circuit 130 stores program data provided through a column selector circuit 140 and charges each bit line with a predetermined voltage (e.g., a power supply voltage or a ground voltage) in accordance with the stored data. In addition, page buffer circuit 130 senses data stored in memory cells of a selected word line during read operations and read verify operations. During a read operation, the sensed data in page buffer circuit 130 is transferred to an external device through column selector circuit 140. During a read verify operation, the sensed data in page buffer circuit 130 is provided to a pass/fail check circuit 150, which determines whether data values transferred through column selector circuit 140 have the correct data value.

Control logic 160 is configured to control the entire operation of flash memory device 100. For example, control logic 160 is configured to control program loops, each of which comprises a bit line setup interval, a program interval, a discharge/recovery interval, and a verification interval. During a programming operation, control logic 160 generates a pump enable signal PUMP_EN when it receives a program command CMD from an external device. During the program interval of a program loop, control logic 160 generates a control signal VPGM_EN, and a program voltage is supplied to a selected word line in accordance with control signal VPGM_EN. Also, before the program interval of a program loop, control logic 160 generates a control signal VPASS_EN as a flag signal, and a pass voltage is supplied to selected and unselected word lines in accordance with control signal VPASS_EN.

As used herein, when a signal is generated or activated "during" an interval, it may be generated or activated at any point within the interval, including at the starting point of the interval, and may be generated or activated multiple times within the interval.

A high voltage generator circuit 170 generates program voltage Vpgm and pass voltage Vpass in a well-known charge pumping manner in accordance with the pump enable signal PUMP_EN. Once program voltage Vpgm and pass voltage Vpass reach their respective target voltages the pumping operation of high voltage generator circuit 170 stops. However, high voltage generator circuit 170 remains in an active state. When program voltage Vpgm drops below a target voltage during a program interval, high voltage generator circuit 170 will resume the pumping operation so that program voltage Vpgm is restored to the target voltage. If program voltage Vpgm is restored to the target voltage, high voltage generator circuit 170 deactivates (i.e., sets to a logic low level) clock enable signal CLK_EN (which is a flag signal and acts as a program voltage restoration signal). The deactivation of clock enable signal CLK_EN indicates that program voltage Vpgm has been restored to the target voltage. During each program loop, a program execution end signal generator circuit 180 generates a program execution end signal PGM_EXE_END in accordance with program voltage restoration signal CLK_EN provided by high voltage generator circuit 170. When program execution end signal PGM_EXE_END is generated, control logic 160 terminates the current program interval and sequentially initiates discharge and read verify operations.

As illustrated by the above description, a program execution time, which corresponds to a program interval of each program loop, is not a fixed time determined in accordance with the conditions described above (e.g., program voltage restoration time and RC delay time), but is determined automatically and efficiently in accordance with program voltage restoration information. Thus, it is possible to shorten the program interval, and thereby reduce the total programming time, by removing the margin, which is not always necessary, and automatically determining the program voltage restoration time and the RC delay time for each program interval. In addition, as the length of the program interval is reduced, the stress placed on the memory cells by the program and pass voltages is mitigated.

Figure 3:
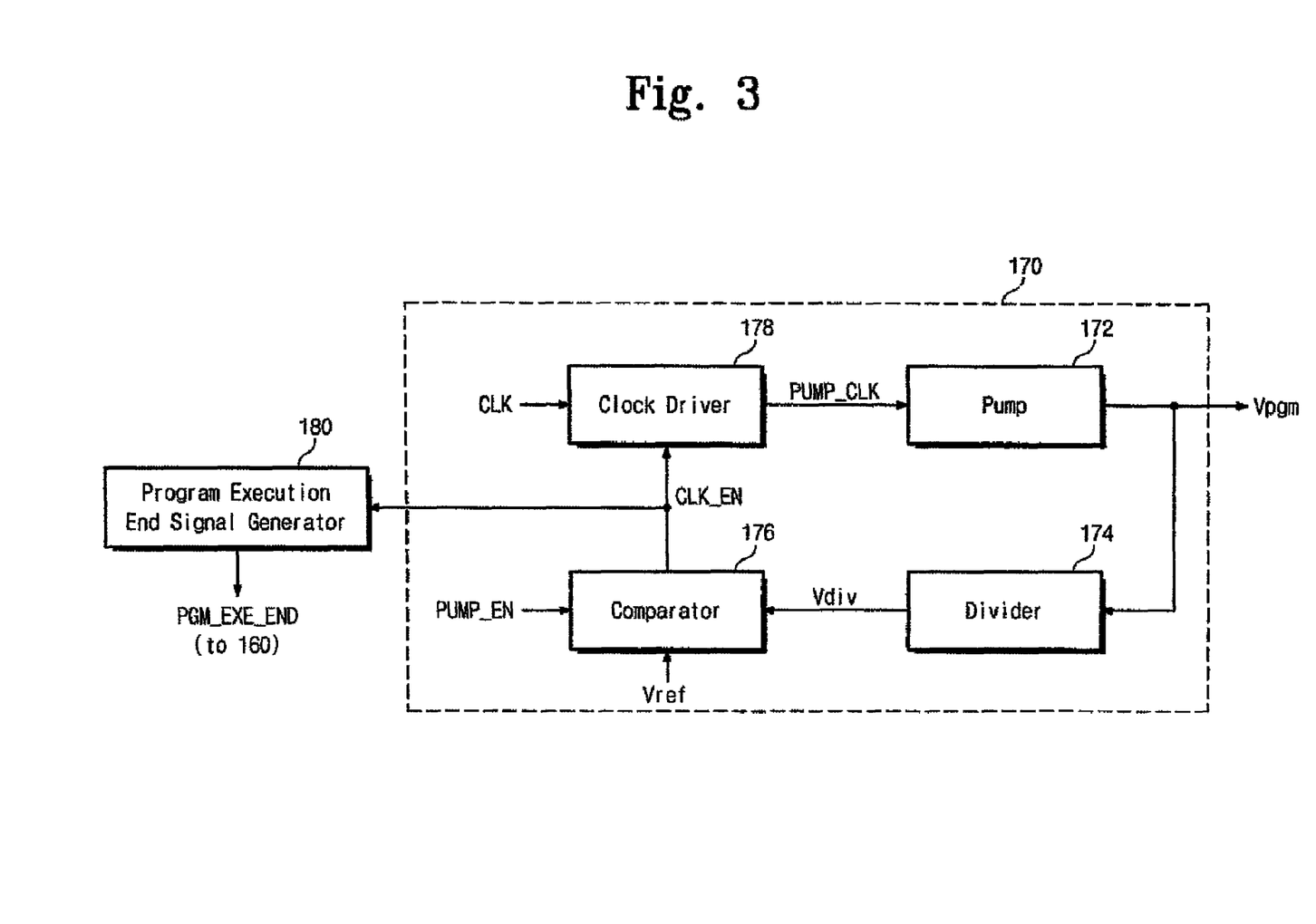
FIG. 3 is a block diagram illustrating a high voltage generator circuit of FIG. 2 in accordance with an exemplary embodiment of the present invention.

FIG. 3 is a block diagram illustrating high voltage generator circuit 170 of FIG. 2 in accordance with an exemplary embodiment of the present invention.

Referring to FIG. 3, high voltage generator circuit 170 comprises a pump 172, a voltage divider 174, a comparator 176, and a clock driver 178. Pump 172 generates a relatively high voltage for program voltage Vpgm in accordance with a pump clock signal PUMP_CLK. Voltage divider 174 divides program voltage Vpgm in order to generate a divided voltage Vdiv. Comparator 176 operates in accordance with a pump enable signal PUMP_EN and compares divided voltage Vdiv with a reference voltage Vref. Comparator 176 activates (i.e., sets to a logic high level) clock enable signal CLK_EN (which acts as a program voltage restoration signal) when divided voltage Vdiv is lower than reference voltage Vref (i.e., when the program voltage Vpgm is lower than the target voltage). Comparator 176 deactivates clock enable signal CLK_EN when the divided voltage Vdiv is greater than or equal to reference voltage Vref (i.e., when the program voltage Vpgm reaches the target voltage). Clock driver 178 selectively outputs a clock signal CLK as pump clock signal PUMP_CLK in accordance with clock enable signal CLK_EN. For example, when clock enable signal CLK_EN has a logic high level, clock driver 178 outputs clock signal CLK as pump clock signal PUMP_CLK. When this occurs, pump 172 performs a pumping operation in accordance with pump clock signal PUMP_CLK. When clock enable signal CLK_EN has a logic low level, clock driver 178 prevents clock signal CLK from being output. When this occurs, pump 172 does not perform the pumping operation.

Once pump enable signal PUMP_EN is activated, high voltage generator circuit 170 generates program voltage Vpgm so that it reaches the target voltage. Pump enable signal PUMP_EN is activated at the beginning of a program mode of operation and is deactivated at an end of the program mode of operation. If program voltage Vpgm reaches the target voltage, clock enable signal CLK_EN (acting as a program voltage restoration signal) is disabled in accordance with a comparison result of comparator 176. When program voltage Vpgm is supplied to a selected word line during a program interval, program voltage Vpgm drops below the target voltage. That is, the program voltage Vpgm dips. Because program voltage Vpgm drops, clock enable signal CLK_EN is activated again. This enables program voltage Vpgm to be restored to the target voltage through the pumping operation of pump 172. That is, an activation-deactivation step of clock enable signal CLK_EN occurs at least once within a program interval of each program loop. In particular, the deactivation of clock enable signal CLK_EN occurs when program voltage Vpgm is restored to a target voltage. As illustrated in FIG. 3, clock enable signal CLK_EN is provided to program execution end signal generator circuit 180 as program voltage restoration information.

Figure 4:
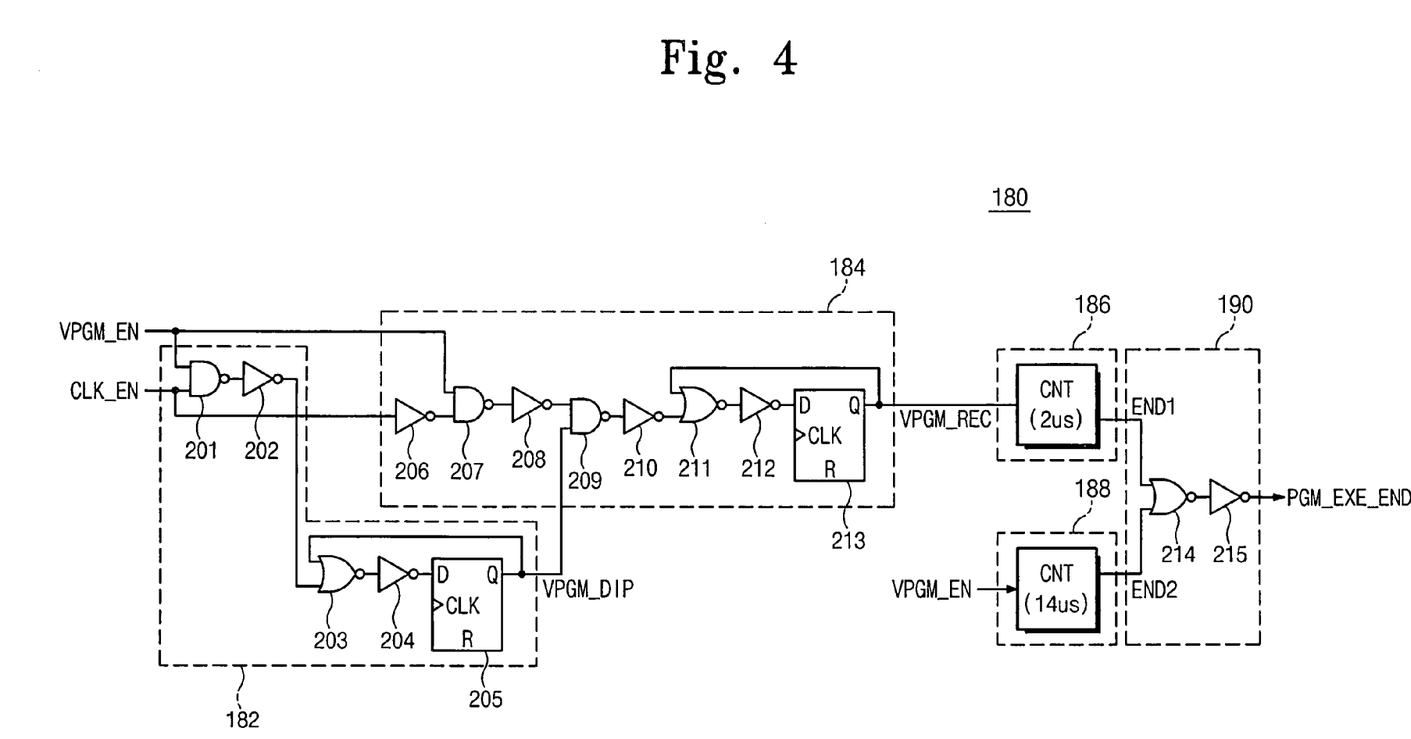
FIG. 4 is a circuit diagram showing a program execution end signal generator circuit of FIG. 2 in accordance with an exemplary embodiment of the present invention.

FIG. 4 is a circuit diagram showing program execution end signal generator circuit 180 of FIG. 2 in accordance with an exemplary embodiment of the present invention.

Referring to FIG. 4, program execution end signal generator circuit 180 comprises a dip signal generator 182, a restoration signal generator 184, a first end signal generator 186, a second end signal generator 188, and a decoder 190. Dip signal generator 182 generates a dip signal VPGM_DIP in accordance with control signal VPGM_EN and clock enable signal CLK_EN. Program voltage Vpgm is supplied to a selected word line in accordance with control signal VPGM_EN, and clock enable signal CLK_EN acts as a program voltage restoration signal. Dip signal generator 182 comprises a NAND gate 201, a NOR gate 203, inverters 202 and 204, and a D flip-flop 205, which are connected as illustrated in FIG. 4. Restoration signal generator circuit 184 generates a restoration signal VPGM_REC in accordance with control signal VPGM_EN, clock enable signal CLK_EN (acting as a program voltage restoration signal), and dip signal VPGM_DIP. Restoration signal generator 184 comprises NAND gates 207 and 209, a NOR gate 211, inverters 206, 208, 210 and 212, and a D flip-flop 213, which are connected as illustrated in FIG. 4. First end signal generator 186 comprises a counter and generates a first end signal END1 in accordance with restoration signal VPGM_REC. Second end signal generator 188 comprises a counter and generates a second end signal END2 in accordance with control signal VPGM_EN. Decoder 190 comprises a NOR gate 214 and an inverter 215 and generates program execution end signal PGM_EXE_END when either one of first and second end signals END1 and END2 is activated.

D flip-flops 205 and 213 are each reset (i.e., set to a logic low level) when power is initially supplied to the flash memory device, and at an end of each program loop. That is, the outputs of D flip-flops 205 and 213 are each set to a logic low level at those times. D flip-flops 205 and 213 operate in synchronization with a clock signal LCLK (refer to FIGS. 5A and 5B).

As described above, if program voltage Vpgm reaches a target voltage, the clock enable signal CLK_EN is deactivated. Before the memory device enters a program loop, control signal VPGM_EN has a logic low level. When control signal VPGM_EN has a logic high level, program voltage Vpgm is supplied to a selected word line. In accordance with these conditions (i.e., VPGM_EN having a logic high level and CLK_EN having logic low level), outputs VPGM_DIP of D flip-flop 205 and VPGM_REC of D flip-flop 213 each maintain their reset level.

Second end signal generator 188 begins to count when control signal VPGM_EN is activated and is adapted to generate second end signal END2 when a counted value reaches a second reference value. In this exemplary embodiment, second end signal generator 188 generates second end signal END2 after control signal VPGM_EN is activated and a time period (e.g., 14 microseconds) has elapsed after control signal VPGM_EN was activated. Although control signal VPGM_EN has a logic high level and one input of NAND gate 207 has a logic high level, restoration signal VPGM_REC maintains a logic low level (i.e., the reset level) because the output of D flip-flop 205, which is dip signal VPGM_DIP has a logic low level.

When control signal VPGM_EN has a logic high level, the program voltage Vpgm is supplied to a selected word line. At this time, program voltage Vpgm drops below a target voltage due to word line loading. When program voltage Vpgm drops below the target voltage, high voltage generator circuit 170 activates clock enable signal CLK_EN. An input of NAND gate 209 in restoration signal generator 184 transitions from a logic high level to a logic low level in accordance with the transition of clock enable signal CLK_EN from a logic low level to a logic high level. Simultaneously, because the control signal VPGM_EN has a logic high level, dip signal generator 182 activates dip signal VPGM_DIP in response to the activation of clock enable signal CLK_EN. Dip signal VPGM_DIP maintains its logic high level until the program loop ends (or, until the verification interval of the program loop commences). Since one of the inputs of NAND gate 209 has a logic high level and the other has a logic low level, an output VPGM_REC of restoration signal generator 184 maintains its logic low level.

If program voltage Vpgm reaches its target voltage in accordance with a pumping operation of pump 172, clock enable signal CLK_EN transitions from a logic high level to a logic low level. This enables the output of NAND gate 209 in restoration signal generator 184 to transition from a logic low level to a logic high level. At this time, the output VPGM_REC of restoration signal generator 184 transitions from a logic low level to a logic high level. When control signal VPGM_REC transitions to a logic high level, first end signal generator 186 begins to count and is adapted to generate first end signal END1 when a counted value reaches a first reference value. In this exemplary embodiment, first end signal generator 186 activates first end signal END1 after a first length of time (e.g., 2 microseconds) elapses after restoration signal VPGM_REC transitions to a logic high level. Decoder 190 may output either one of first and second end signals END1 and END2 as program execution end signal PGM_EXE_END (i.e., whichever end signal has a logic high level).

In this exemplary embodiment, a second length of time, which is used by second end signal generator 188, is a length of time that is determined in accordance with the worst case conditions described previously. Thus, after control signal VPGM_EN is activated, first end signal END1 is typically activated before second end signal END2 is activated. Second end signal END2 is a signal that forcibly terminates a program loop when the program loop, due to unpredictable malfunctions of high voltage generator circuit 170 and/or program execution end signal generator circuit 180, has not already been terminated through first end signal END1.

Figure 5A:
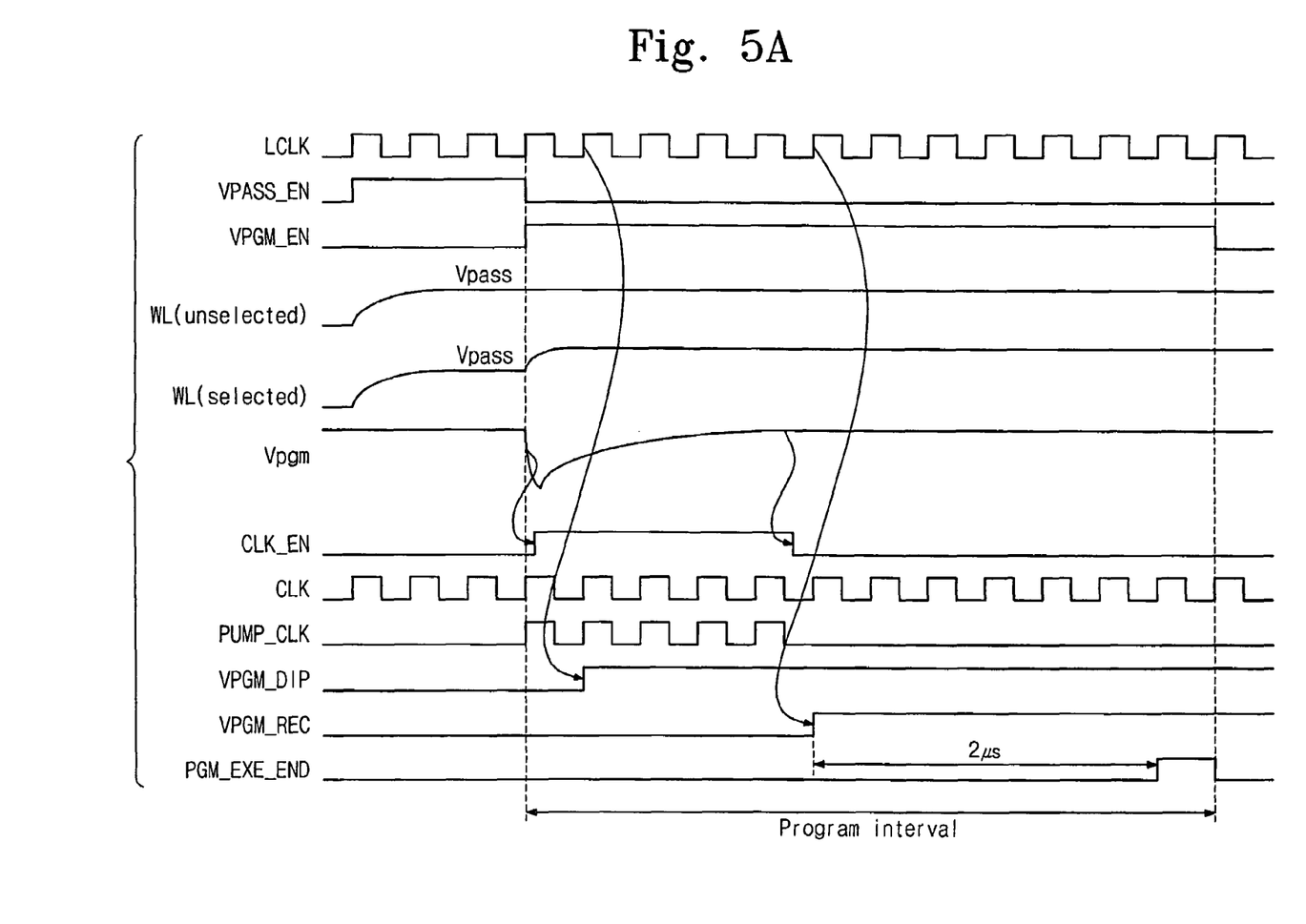
FIGS. 5A and 5B are timing diagrams illustrating an exemplary programming operation for an exemplary embodiment of the flash memory device of the present invention; and, FIG. 6 is a block diagram showing a flash memory device in accordance with another exemplary embodiment of the present invention.
Figure 5B:
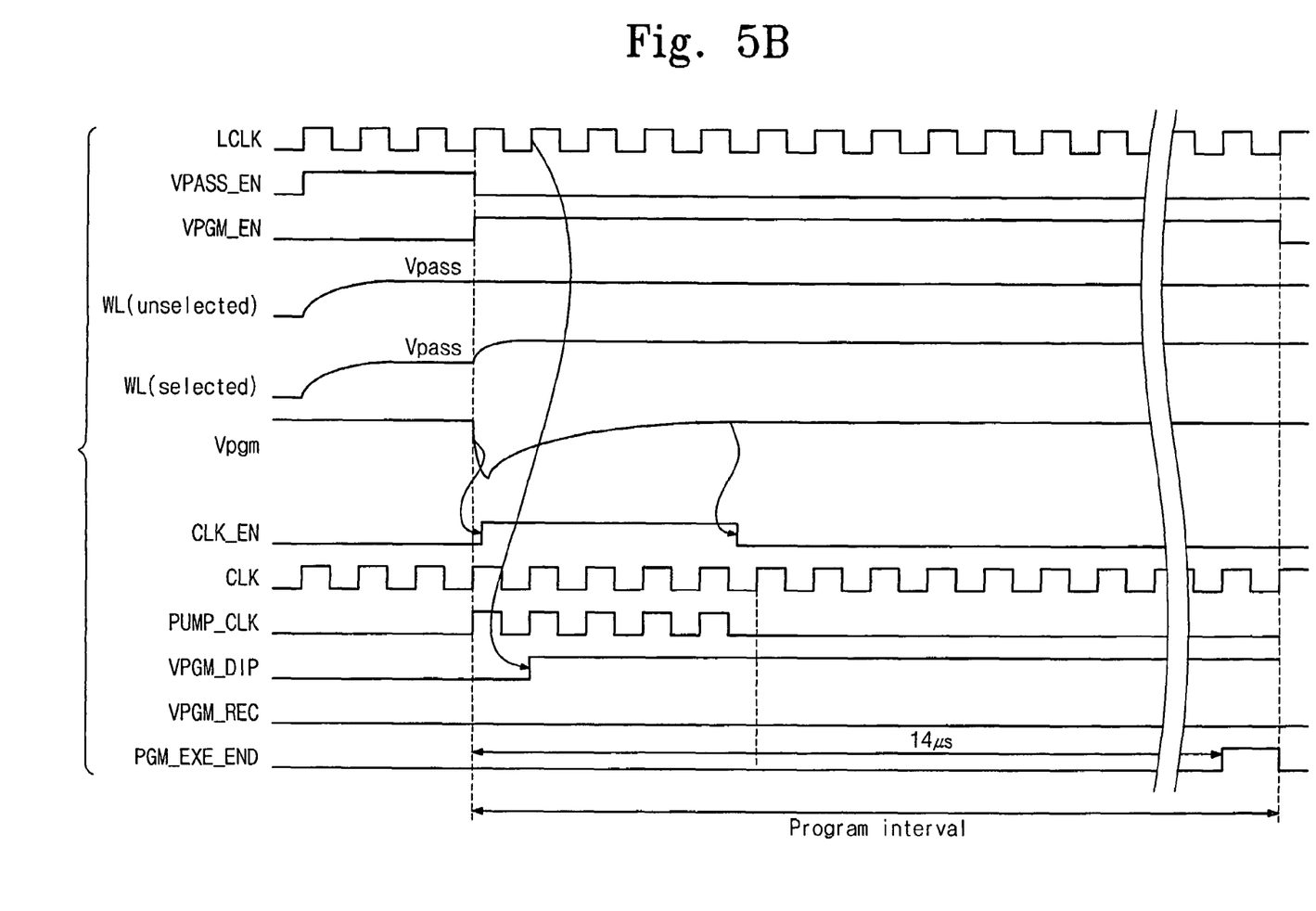

FIGS. 5A and 5B are timing diagrams illustrating an exemplary programming operation for an exemplary embodiment of the flash memory device of the present invention. The exemplary programming operation will now be described in detail with reference to FIGS. 2, 5A, and 5B. In FIGS. 5A and 5B, only the timing corresponding to the program interval of a program loop, and the time just before the program interval, is illustrated.

In order to program memory cells of a selected row (or word line), program data is first loaded into a page buffer circuit 130 through a column selector circuit 140. Once the program data is loaded, flash memory device 100 programs the loaded data into memory cells in response to the input of a program command CMD. This process will be described in more detail below.

In response to program command signal CMD, control logic 160 generates pump enable signal PUMP_EN. In accordance with pump enable signal PUMP_EN, high voltage generator circuit 170 prepares high voltages (e.g., program and pass voltages) that will be applied to word lines during a programming operation. If the high voltages are prepared, control logic 160 executes a first program loop. During a bit line setup interval of the program loop, bit lines BL0 through BL(n−1) are charged to a power supply voltage or a ground voltage through page buffer circuit 130 in accordance with the loaded data and under the control of control logic 160.

If a program interval is going to commence, control logic 160 activates control signal VPASS_EN before the program interval begins, and row selector circuit 120 provides word lines with pass voltage Vpass from high voltage generator circuit 170 in accordance with the activated control signal VPASS_EN. After a time elapses, control logic 160 deactivates control signal VPASS_EN and simultaneously activates control signal VPGM_EN, and the program interval commences. Row selector circuit 120 supplies a selected word line with program voltage Vpgm from high voltage generator circuit 170 in accordance with activated control signal VPGM_EN. Second end signal generator 188 of FIG. 4 begins to count when control signal VPGM_EN is activated. As program voltage Vpgm is supplied to the selected word line, program voltage Vpgm dips, as illustrated in FIGS. 5A and 5B. That is, program voltage Vpgm drops below its target voltage.

When program voltage Vpgm drops below the target voltage, high voltage generator circuit 170 activates clock enable signal CLK_EN, which will act as a program voltage recovery signal. Referring to FIG. 4, one input of NAND gate 209 in restoration signal generator 184 transitions to a logic low level in accordance with the activation of clock enable signal CLK_EN. At the same time, since control signal VPGM_EN has a logic high level, dip signal generator 182 activates dip signal VPGM_DIP in response to the activation of clock enable signal CLK_EN. Dip signal VPGM_DIP maintains its logic high level until the program loop is terminated (or, until a verification interval of a program loop commences). Since one input of NAND gate 209 has logic high level and the other has a logic low level, the output VPGM_REC of restoration signal generator 184 maintains a logic low level.

FIG. 5A illustrates a program interval in which program execution end signal PGM_EXE_END transitions to a logic high level after the first length of time elapses after the transition of restoration signal VPGM_REC to a logic high level. If program voltage Vpgm reaches its target voltage in accordance with the pumping operation of pump172, clock enable signal CLK_EN transitions from a logic high level to a logic low level. Referring to FIG. 4, this enables an output of NAND gate 209 of restoration signal generator 184 to transition from a logic low level to a logic high level. When this occurs, the output VPGM_REC of restoration signal generator 184 transitions to a logic high level. When control signal VPGM_REC transitions to a logic high level, first end signal generator 186 begins to count. In this exemplary embodiment, first end signal generator 186 activates first end signal END1 after the first length of time (e.g., 2 microseconds) elapses after restoration signal VPGM_REC transitions to a logic high level. Decoder 190 then outputs first end signal END1 as program execution end signal PGM_EXE_END. When program execution end signal PGM_EXE_END transitions to a logic high level, control logic 160 terminates the program interval, and sequentially executes a discharge interval and a verification interval. Operations of the discharge and verification intervals are well known to those skilled in the art, so a description of those intervals will be omitted.

FIG. 5B illustrates a program interval in which program execution end signal PGM_EXE_END transitions to a logic high level after the second length of time elapses after the transition of control signal VPGM_EN to a logic high level. After a second length of time (e.g., 14 microseconds) has elapsed since control signal VPGM_EN was activated, if first end signal END1 has not already been activated and thereby terminated the program interval, second end signal END2 is activated by second end signal generator 188. Second end signal END2 is output as program execution end signal PGM_EXE_END through decoder 190. Likewise, when program execution end signal PGM_EXE_END is activated, control logic 160 terminates the program interval, and sequentially executes a discharge interval and a verification interval.

Figure 6:
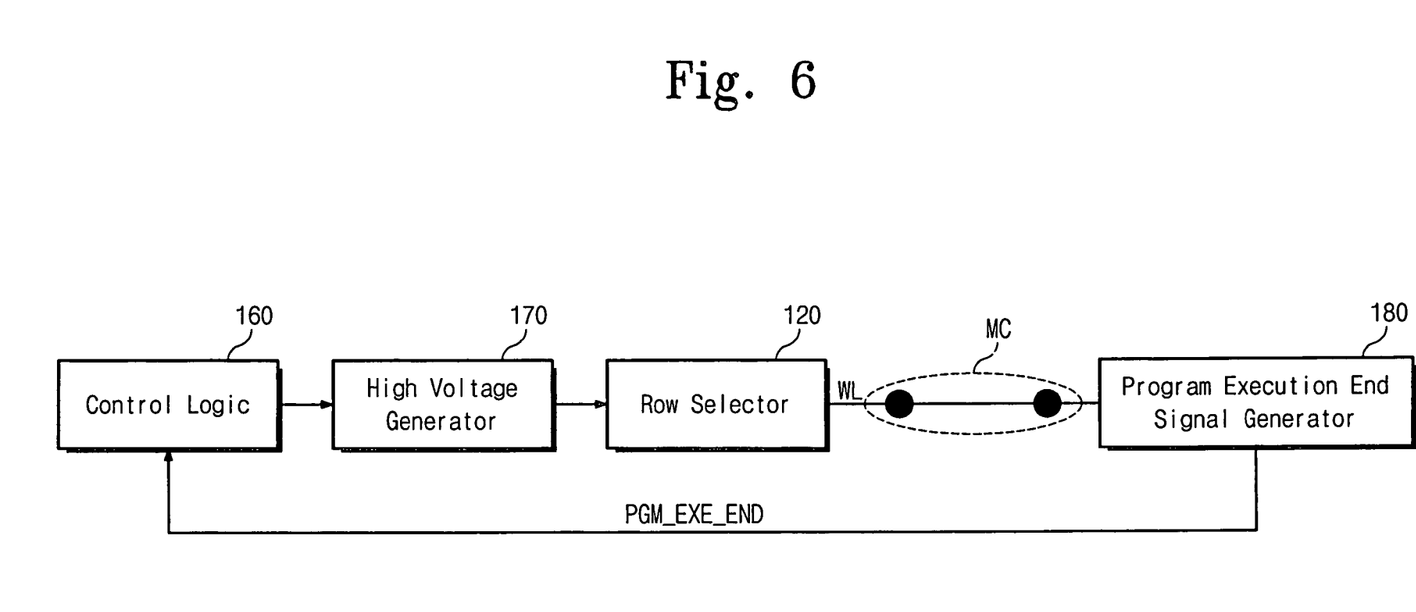

In accordance with an exemplary embodiment of the present flash memory device, the length of a program interval is automatically determined in accordance with a clock enable signal that acts as program voltage recovery information. But, it will be clear to those skilled in the art that the present invention is not limited to this exemplary embodiment. For example, as illustrated in FIG. 6, one end of a word line is connected to a row selector circuit 120, and whether the voltage of the word line reaches the program voltage Vpgm is detected at the other end of the word line by a program execution end signal generator 180'. The detected information is used as the program voltage recovery signal, and program execution end signal generator 180' generates a program execution end signal PGM_EXE_END in accordance with the program voltage recovery signal. Program execution end signal generator circuit 180' comprises second end signal generator 188 illustrated in FIG. 4. As in the previously described exemplary embodiment, when program execution end signal PGM_EXE_END is generated, control logic 160 terminates the current program interval. Also, as in the previously described exemplary embodiment, the memory device illustrated in FIG. 6 enables a program interval to be determined efficiently and the stress placed on the memory cells by the program and pass voltages to be mitigated.

In the exemplary embodiments described previously, a program execution time corresponding to a program interval of each program loop is not a fixed time determined in accordance with the conditions described previously (e.g., program voltage restoration time and RC delay time), but is determined automatically and efficiently in accordance with program voltage restoration information. Thus, it is possible to reduce the program execution time (i.e., the length of the program interval), and thereby reduce the total programming time, by removing the margin, which is not always necessary, and automatically determining the program voltage restoration time and a RC delay time for each program interval. In addition, as the program execution time is reduced (i.e., the length of the program interval is shortened), the stress placed on the memory cells by the program and pass voltages is mitigated.

The invention has been described using exemplary embodiments; however, it will be understood that the scope of the invention is not limited to only the disclosed embodiments. Rather, the scope of the invention is intended to encompass various modifications and similar arrangements. The scope of the claims, therefore, should be accorded the broadest interpretation so as to encompass all such modifications and similar arrangements.

What is claimed is:

1. A flash memory device comprising:
control logic adapted to activate a control signal during a program interval of a program loop when a program voltage reaches a target voltage, wherein the program voltage is supplied to a selected word line in accordance with the control signal;
a high voltage generator circuit adapted to generate the program voltage and generate a flag signal during the program interval, wherein the flag signal indicates whether the program voltage has been restored to the target voltage; and,
a program execution end signal generator circuit adapted to generate a program execution end signal in accordance with the control signal and the flag signal,
wherein, upon generation of the program execution end signal, the control logic deactivates the control signal in order to terminate the program interval.

2. The flash memory device of claim 1, wherein the control logic is further adapted to generate a pump enable signal in response to receiving a program command, and wherein the high voltage generator circuit is further adapted to generate the program voltage in accordance with the pump enable signal.

3. The flash memory device of claim 2, wherein the high voltage generator circuit comprises:
a voltage divider adapted to divide the program voltage and provide a divided voltage to a comparator, wherein the comparator is adapted to operate in accordance with the pump enable signal and further adapted to output a clock enable signal in accordance with a comparison of the divided voltage and a reference voltage; and, a clock driver adapted to receive the clock enable signal from the comparator and provide a clock signal to a pump as a pump clock signal in accordance with the clock enable signal;

wherein the pump is adapted to generate the program voltage in accordance with the pump clock signal and the clock enable signal is provided to the program execution end signal generator circuit as the flag signal.

4. The flash memory device of claim 3, wherein the program execution end signal generator circuit is adapted to generate the program execution end signal during the program interval following a time lapse after the second flag signal has been deactivated.

5. The flash memory device of claim 4, wherein the high voltage generator circuit is adapted to activate the flag signal during the program interval to indicate that the program voltage has dropped below the target voltage and deactivate the flag signal during the program interval to indicate that the program voltage has been restored to the target voltage.

6. The flash memory device of claim 4, wherein the program execution end signal generator circuit comprises a first end signal generator adapted to generate a first end signal in response to deactivation of the flag signal.

7. The flash memory device of claim 6, wherein the first end signal generator comprises a counter adapted to begin counting in response to the deactivation of the flag signal, and further adapted to generate the first end signal when a counted value reaches a first reference value.

8. The flash memory device of claim 7, wherein the program execution end signal generator circuit further comprises a second end signal generator adapted to generate a second end signal in response to the control signal.

9. The flash memory device of claim 8, wherein the second end signal generator comprises a counter adapted to begin counting in accordance with the activation of the control signal, and further adapted to generate the second end signal when a counted value reaches a second reference value.

10. The flash memory device of claim 9, wherein the first reference value is less than the second reference value.

11. The flash memory device of claim 8, wherein the program execution end signal generator circuit further comprises a decoder adapted to output as the program execution end signal either one of the first end signal and the second end signal.

12. A method of programming a flash memory device comprising:

preparing a program voltage when a program command is received;

activating a control signal when the program voltage reaches a target voltage;

supplying the program voltage to a selected word line during a program interval of a program loop in accordance with the control signal;

generating a flag signal indicative of whether the program voltage has been restored to the target voltage; and terminating the program interval in response to the flag signal or following a lapse of a first length of time after the control signal is activated.

13. The method of claim 12, wherein terminating the program interval in response to the flag signal comprises terminating the program interval following a lapse of a second length of time after the flag signal indicates that the program voltage has reached the target voltage.

14. The method of claim 13, wherein terminating the program interval following the lapse of the first length of time after the control signal is activated conditionally follows non-termination of the program interval after the program voltage reaches the target voltage and the lapse of the second length of time.

15. The method of claim 14, wherein the second length of time is shorter than the first length of time.

16. The method of claim 15, wherein the second length of time is a period of time required to set control gates of memory cells in the selected word line to the program voltage.

17. The flash memory device of claim 6, wherein the first end signal generator comprises a counter adapted to begin counting in response to the deactivation of the flag signal, and further adapted to generate the first end signal after a first length of time after the counter of the first end signal generator begins counting.

18. The flash memory device of claim 17, wherein the program execution end signal generator circuit further comprises a second end signal generator adapted to generate a second end signal in response to the control signal.

19. The flash memory device of claim 18, wherein the second end signal generator comprises a counter adapted to begin counting in accordance with the activation of the control signal, and further adapted to generate the second end signal after a second length of time after the counter of the second end signal generator begins counting.

20. The flash memory device of claim 19, wherein the first length of time is shorter than the second length of time.

* * * * *